United States Patent
Tomita et al.

(10) Patent No.: US 7,411,669 B2
(45) Date of Patent: Aug. 12, 2008

(54) SUBSTRATE DEFECT INSPECTION METHOD, COMPUTER READABLE STORAGE MEDIUM, AND DEFECT INSPECTION APPARATUS

(75) Inventors: Hiroshi Tomita, Koshi (JP); Shinichi Shinozuka, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/626,028

(22) Filed: Jan. 23, 2007

(65) Prior Publication Data

US 2007/0182955 A1 Aug. 9, 2007

(30) Foreign Application Priority Data

Feb. 8, 2006 (JP) .............................. 2006-030841

(51) Int. Cl.
*G01N 21/00* (2006.01)
*G06K 9/00* (2006.01)
(52) U.S. Cl. .............. 356/237.1; 356/237.4; 356/237.5; 382/154
(58) Field of Classification Search ... 356/237.1–237.5, 356/394; 250/559.44, 559.45; 382/141, 382/144–145, 154, 168; 355/52–53
See application file for complete search history.

(56) References Cited

U.S. PATENT DOCUMENTS

| | | | | |
|---|---|---|---|---|
| 5,367,375 A | * | 11/1994 | Siebert | ........................ 356/520 |
| 6,809,797 B2 | * | 10/2004 | Baselmans et al. | ............ 355/52 |
| 7,027,143 B1 | * | 4/2006 | Stokowski et al. | ....... 356/237.2 |
| 7,038,773 B2 | * | 5/2006 | Kuhlmann et al. | ....... 356/237.4 |

FOREIGN PATENT DOCUMENTS

| | | |
|---|---|---|
| JP | 6-18436 | 1/1994 |
| JP | 2000-235949 | 8/2000 |
| JP | 2001-168010 | 6/2001 |
| JP | 2004-85503 | 3/2004 |

* cited by examiner

*Primary Examiner*—Sang Nguyen
(74) *Attorney, Agent, or Firm*—Oblon, Spivak, McClelland, Maier & Neustadt, P.C.

(57) ABSTRACT

In the present invention, data on a substrate image picked up by an image pickup unit is outputted to a difference calculation unit where a difference image from a normal substrate is calculated. A synthesis calculation unit calculates a synthesized image by rotating the difference image 360 degrees by every predetermined angle about the center of the substrate and synthesizing the images. A Zernike calculation unit digitizes the synthesized image by a Zernike polynomial and outputs a concentric circle component to a determination unit where the component is compared with a previously set threshold value, so that the presence or absence of a defect on the substrate is determined. The present invention can facilitate the determination of the presence or absence of a macro defect on the substrate and reduce the time required for the determination.

11 Claims, 13 Drawing Sheets

|  | R | G | B |
|---|---|---|---|
| → Z01 | 34.846 | 33.026 | 23.062 |
| Z02 | −0.014 | −0.011 | −0.007 |
| Z03 | 0.014 | 0.013 | 0.003 |
| → Z04 | −9.550 | −8.697 | −3.516 |
| Z05 | −0.001 | 0.005 | 0.000 |
| Z06 | 0.007 | −0.001 | 0.006 |
| Z07 | −0.015 | −0.010 | −0.004 |
| Z08 | −0.004 | −0.002 | 0.009 |
| → Z09 | −22.737 | −21.153 | −11.963 |
| Z10 | 0.014 | 0.015 | 0.008 |
| Z11 | 0.003 | 0.001 | −0.010 |
| Z12 | 0.007 | −0.003 | −0.004 |
| Z13 | 0.039 | 0.068 | 0.053 |
| Z14 | 0.039 | 0.042 | 0.030 |
| Z15 | −0.045 | −0.041 | −0.027 |
| → Z16 | 25.601 | 24.064 | 14.076 |

|  | R | G | B |
|---|---|---|---|
| → Z01 | 25.608 | 25.198 | 18.309 |
| Z02 | 0.000 | 0.004 | 0.013 |
| Z03 | −0.011 | −0.016 | −0.013 |
| → Z04 | 23.623 | 23.616 | 16.038 |
| Z05 | 0.008 | 0.008 | 0.015 |
| Z06 | 0.019 | 0.014 | 0.020 |
| Z07 | −0.022 | −0.016 | 0.010 |
| Z08 | 0.008 | 0.000 | −0.009 |
| → Z09 | 24.029 | 23.745 | 14.741 |
| Z10 | −0.076 | −0.077 | −0.032 |
| Z11 | −0.062 | −0.059 | −0.049 |
| Z12 | 0.040 | 0.032 | 0.026 |
| Z13 | 0.056 | 0.055 | 0.040 |
| Z14 | −0.090 | −0.089 | −0.030 |
| Z15 | 0.095 | 0.094 | 0.029 |
| → Z16 | 12.042 | 12.572 | 10.275 |

SUBSTRATE DEFECT INSPECTION METHOD, COMPUTER READABLE STORAGE MEDIUM, AND DEFECT INSPECTION APPARATUS

BACKGROUND OF THE INVENTION

1. Field of the Invention

The present invention relates to a substrate defect inspection method, a computer readable storage medium storing a program for causing a computer to execute the method, and a defect inspection apparatus.

2. Description of the Related Art

In a photolithography process in a manufacturing process of a semiconductor device, for example, a resist coating treatment for forming a resist film on a front surface of a substrate such as a wafer, exposure processing for irradiating a pattern on the front surface of the substrate for exposure, a developing treatment for developing the substrate after the exposure and so on are performed. The substrate for which a series of predetermined photolithography process steps has been completed is subjected to a so-called macro defect inspection by an inspection unit, such as whether or not a predetermined resist film is formed on the front surface of the substrate, or whether or not appropriate exposure processing is performed.

The above-described macro defect inspection is performed by moving a mounting table mounting a substrate thereon in X- and Y-directions on the same plane and causing an image pickup means such as a CCD camera fixedly provided above the substrate to scan the top of the substrate so as to pick up an image of the front surface of the substrate (Japanese Patent Application Laid-open No. 2001-168010). The image obtained by the image pickup is subjected to image processing to detect the presence or absence of a defect. In more detail, there occurs a difference in luminance or in brightness and darkness in picked-up images between a normal substrate and a substrate having a macro defect such as defocus, uneven application or the like, the difference appearing as a difference in pixel value on image data. In the prior art, the difference is utilized to obtain a difference image of an absolute value by subtracting the image of a normal substrate from the image of the substrate being an inspection object, and the difference image is simply binarized into numerical values, so that whether the substrate is normal or abnormal, that is, whether there is a defect, is determined depending on whether the numerical value exceeds a previously set threshold value (Japanese Patent Application Laid-open No. H6-18436 and Japanese Patent Application Laid-open No. 2004-85503).

In the above-described method, however, if the difference image is binarized, for example, it is difficult to set the threshold value as a reference to perform determination whether the substrate is normal or abnormal because the absolute values of the binarized values are small, and therefore erroneous determination can be made. Besides, it is necessary to accurately mount the substrate being the inspection object at a predetermined image pickup position in all of the X-direction, Y-direction and θ-direction when picking up an image of the substrate. This additionally requires an alignment work using, for example, a notch aligner or the like for the accurate mounting, thus taking extra inspection time.

SUMMARY OF THE INVENTION

The present invention has been developed in consideration of the above viewpoints, and a first object thereof is to facilitate setting of a threshold value to determine whether the substrate is normal or abnormal in a substrate defect inspection method using an image so as to improve the determination accuracy. A second object thereof is to reduce the inspection time by eliminating alignment of the substrate in the θ-direction.

To achieve the above objects, the present invention is a method of inspecting a substrate for a defect, including the steps of: obtaining a difference image between an image of a normal substrate and an image of an inspection object; rotating the difference image 360 degrees by every predetermined angle about a center of the substrate, and synthesizing the difference image before the rotation and the difference image after the rotation so that each pixel value of the synthesized image is increased; digitizing using a Zernike polynomial the image obtained by the synthesis; and determining the presence or absence of a defect on the substrate based on a Zernike value of a concentric circle component out of Zernike values digitized by the Zernike polynomial.

By rotating the above-described difference image 360 degrees by every predetermined angle about the center of the substrate and synthesizing the images, a concentric circle pattern appears in the image after the synthesis. When the synthesized image is converted into a Zernike polynomial for digitization, the values of the Zernike coefficients of the concentric circle components in Zernike terms are amplified. Conversely, the values of Zernike terms other than the concentric circle components are close to 0.

Accordingly, a portion in the difference image considered to be defective is shown by an amplified value as a result and has a distinct difference from other normal portions. Hence, a threshold value can be set between those values to facilitate determination of the presence or absence of a defect. Further, the setting of the threshold value itself is also easy. Besides, since the determination is made based on the image created by rotating the difference image and synthesizing the images, alignment of the substrate in the θ-direction is unnecessary. This eliminates the necessity to perform alignment processing by a notch aligner to accordingly reduce the time required for inspection.

To create a synthesized image by rotation, the rotation angle is preferably equal to or less than 10 degrees. This results in a synthesized image which is more recognizable as a concentric circle. Further, when the image is a color image, the presence or absence of a defect on the substrate may be determined based on the value of the concentric circle component of at least one of R, G, and B out of the Zernike values transformed by the Zernike polynomial. As a matter of course, the presence or absence of a defect on the substrate may be determined based on the values of the concentric circle components of all of R, G, and B.

The above-described inspection method is implemented, for example, by a defect inspection apparatus. In this case, to cause a computer in a controller of the defect inspection apparatus to execute the defect inspection method, according to another aspect of the present invention, the inspection method is programmed and stored in a computer readable storage medium.

According to still another aspect, the present invention is a defect inspection apparatus for inspecting a substrate for a defect, including: a stage mounting the substrate thereon and movable in an X-direction and a Y-direction; an image pickup unit for picking up an image of the substrate on the stage; a difference calculation unit for calculating an absolute value of a difference between image data obtained by the image pickup unit and previously stored image data on a normal substrate, and outputting data on a difference image based on the difference absolute value; a synthesis calculation unit for rotating the difference image obtained by the difference calculation unit about a center of the substrate, and synthesizing the rotated difference images to obtain a synthesized image; a Zernike calculation unit for digitizing the synthesized image obtained by the synthesis calculation unit by a Zernike polynomial; and a determination unit for comparing data outputted from the Zernike calculation unit with a previously set threshold value.

According to the present invention, when performing a defect inspection for the substrate using an image, a threshold value to determine whether the substrate is normal or abnormal can be easily set, with the result that the determination accuracy can be improved as compared with the prior art. Further, since the alignment of the substrate in the θ-direction is unnecessary, the inspection time can be reduced as compared with the prior art.

DETAILED DESCRIPTION OF THE INVENTION

Figure 1:
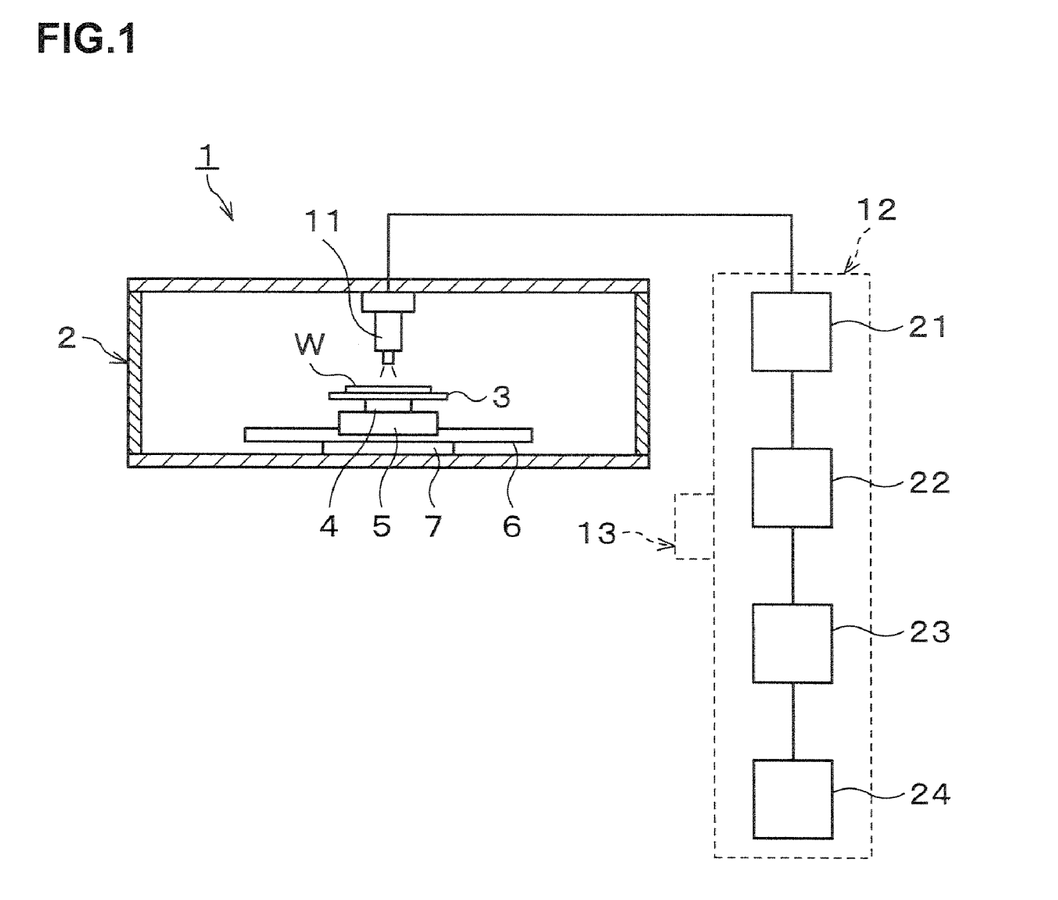
FIG. 1 is an explanatory view showing a configuration of an inspection apparatus used in implementing an inspection method according to the present embodiment.

Hereinafter, a preferred embodiment of the present invention will be described. FIG. 1 shows the outline of an inspection apparatus 1 used to carry out an inspection method according to the embodiment, the inspection apparatus 1 being configured as an apparatus of inspecting for a so-called macro-defect. In a casing 2 of the inspection apparatus, a stage 3 is provided which holds by suction a substrate being an inspection object such as a wafer W. The stage 3 can be rotated by θ by a rotation unit 4 such that it can be rotated to an arbitrary angle and stopped. A base 5 for supporting the stage 3 houses a rotation drive unit which rotates the stage 3, such as a serve motor or the like.

The base 5 is provided such that the entire base 5 is movable on a rail 6 extending in an X-direction (a right-to-left direction in FIG. 1), and is movable in the X-direction by means of a not-shown drive mechanism. Besides, the rail 6 itself is provided to be movable on a rail 7 extending in a Y-direction perpendicular to the X-direction and is thus movable in the Y-direction by means of a not shown drive mechanism. Accordingly the stage 3 is rotatable in the horizontal direction and movable in the X-direction and the Y-direction.

Above the stage 3, an image pickup apparatus, such as a CCD camera 11, for capturing an image of a front surface of the wafer W is provided. The CCD camera 11 is provided directed to the front surface of the wafer W on the stage 3. Movement of the above-described stage 3 in the X-direction and the Y-direction allows the CCD camera 11 to take an image of predetermined regions on the wafer W on a shot-by-shot basis, for example, on a one-device region basis. Accordingly, after image pickup for one shot, the stage 3 is moved in the X-direction and the Y-direction as necessary and the CCD camera 11 is used to pick up an image every movement, whereby the image of the entire surface of the wafer W can be picked up. Data of image picked up by the CCD camera 11 is outputted to a control unit 12 provided outside the inspection apparatus 1.

The control unit 12 has a difference calculation unit 21 for calculating a difference (absolute vale) between the transmitted image data and previously stored image data on a normal wafer and outputting data on a difference image based on the calculation; a synthesis calculation unit 22 for rotating the difference image obtained by the difference calculation unit 21 about the center of the wafer W and synthesizing the rotated difference images to obtain a synthesized image; a Zernike calculation unit 23 for digitizing the synthesized image obtained by the synthesis calculation unit 22 by a Zernike polynomial; and a determination unit 24 for determining the presence or absence of a defect by comparing data outputted from the Zernike calculation unit 23 with a previously set threshold value.

In more detail, the synthesis calculation unit 22 performs processing of rotating the difference image from the difference calculation unit 21 about the center of the wafer W 360 degrees by every predetermined angle and synthesizing the difference image before the rotation and the difference image after the rotation so that each pixel value of the image after synthesis is increased. The image is stored in the form of data with a resolution of, for example, about 2000 by 2000 pixels.

The Zernike calculation unit 23 performs processing of decomposing the synthesized image obtained by the synthesis calculation unit 22 into a Zernike polynomial to thereby digitize it for each Zernike coefficient.

The Zernike polynomial is a complex function on a unit circle with a radius of 1 (practically used as a real function) which is often used in the optical field, and has arguments (r, θ) of polar coordinates. The Zernike polynomial is mainly used to analyze the aberration component of a lens in the optical field, and the wavefront aberration is decomposed into the Zernike polynomial, whereby the aberration components based on the shape of each independent wavefront, for example, a mount shape, a saddle shape, or the like can be known. Use of the Zernike polynomial allows display of the aberration in an image based on gradation of colors by plotting on a two-dimensional plane using, for example, black and white, or light's three primary colors (R, G, and B). On the contrary, the picked-up image can be decomposed into a Zernike polynomial based on each aberration component for display.

In this embodiment, the synthesized image obtained by the synthesis calculation unit 22 is processed to be decomposed into the following Zernike polynomial for analysis.

| | |
|---|---|
| 1 | Z1 |
| $r \cdot \cos \theta$ | Z2 |
| $r \cdot \sin \theta$ | Z3 |
| $2r^2 - 1$ | Z4 |
| $r^2 \cdot \cos 2\theta$ | Z5 |
| $r^2 \cdot \sin 2\theta$ | Z6 |
| $(3r^3 - 2r) \cdot \cos \theta$ | Z7 |
| $(3r^3 - 2r) \cdot \sin \theta$ | Z8 |
| $6r^4 - 6r^2 + 1$ | Z9 |
| $r^3 \cdot \cos 3\theta$ | Z10 |
| $r^3 \cdot \sin 3\theta$ | Z11 |
| $(4r^4 - 3r^2) \cdot \cos 2\theta$ | Z12 |
| $(4r^4 - 3r^2) \cdot \sin 2\theta$ | Z13 |
| $(10r^5 - 12r^3 + 3r) \cdot \cos \theta$ | Z14 |
| $(10r^5 - 12r^3 + 3r) \cdot \sin \theta$ | Z15 |
| $20r^6 - 30r^4 + 12r^2 - 1$ | Z16 |

Figure 2:
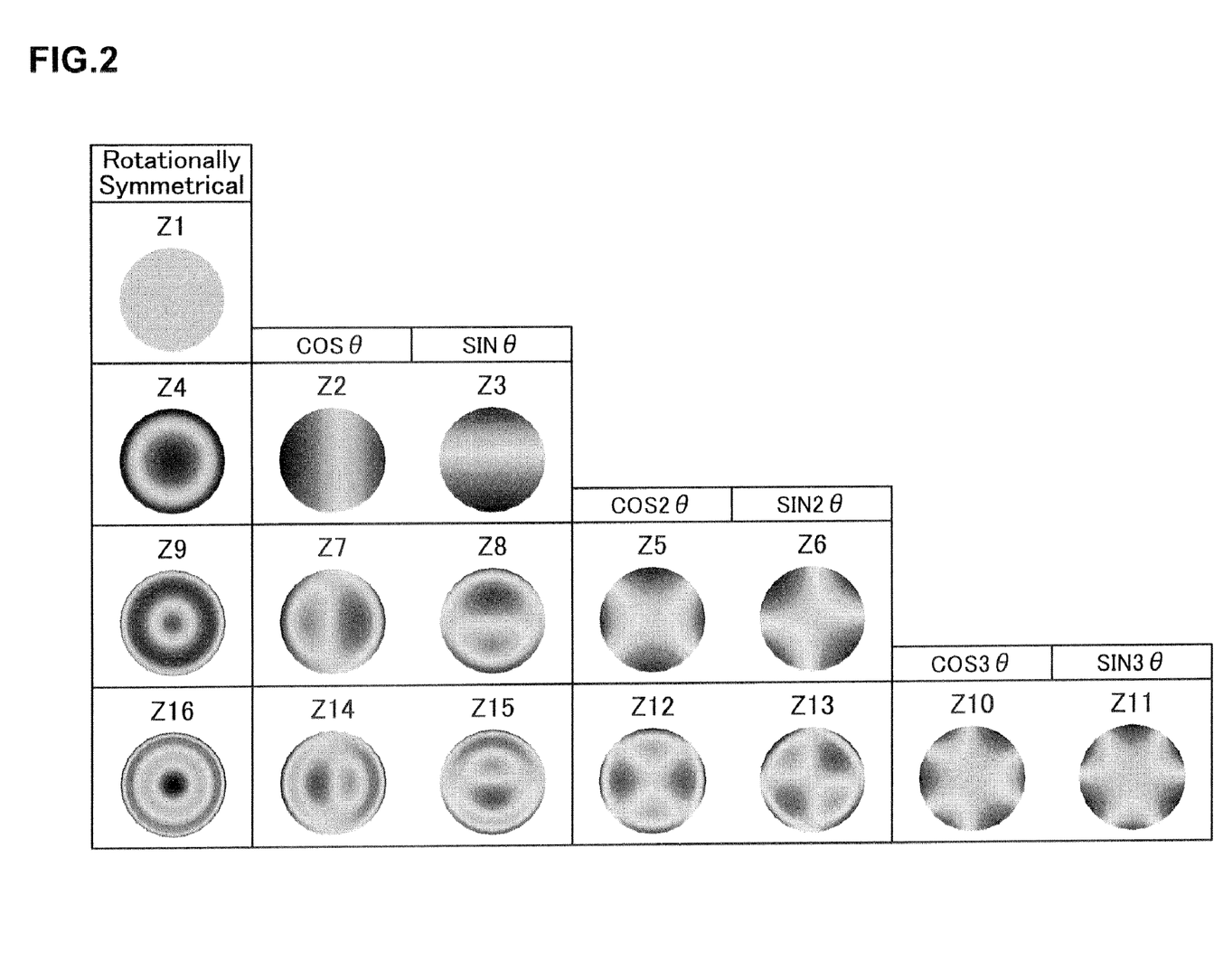
FIG. 2 is an explanatory view showing an image for each component after an image is decomposed into components using a Zernike polynomial.

The images decomposed into Zernike coefficients in the above-described Zernike polynomial are as shown in FIG. 2. The coefficients of a column at the left end in FIG. 2, that is, the Zermike coefficients of Z1, Z4, Z9 and Z16 represent concentric circle components.

The Zernike calculation unit 23 performs decomposition into the above-described Zernike polynomial and analysis to calculate a Zernike value for each coefficient, extracts among from the values only the values of the Zernike coefficients of Z1, Z4, Z9 and Z16 being concentric circle components, and outputs them to the determination unit 24.

The determination unit 24 compares previously set threshold values to identify whether the wafer W is normal or abnormal with the values of the Zernike coefficients of Z1, Z4, Z9 and Z16, so that if even there is one coefficient having a value exceeding its threshold value, the determination unit 24 determines that the wafer is abnormal and outputs its signal to the external part.

The above-described control unit 12 is composed of a computer such as a personal computer or the like, and the processing of the difference calculation unit 21, the synthesis calculation unit 22, the Zernike calculation unit 23, and the determination unit 24 is executed by a program stored in a program storage unit 13. The program storage unit 13 is a recording medium, such as a hard disk, compact disk, magneto-optical disk, memory card or the like.

Figure 3:
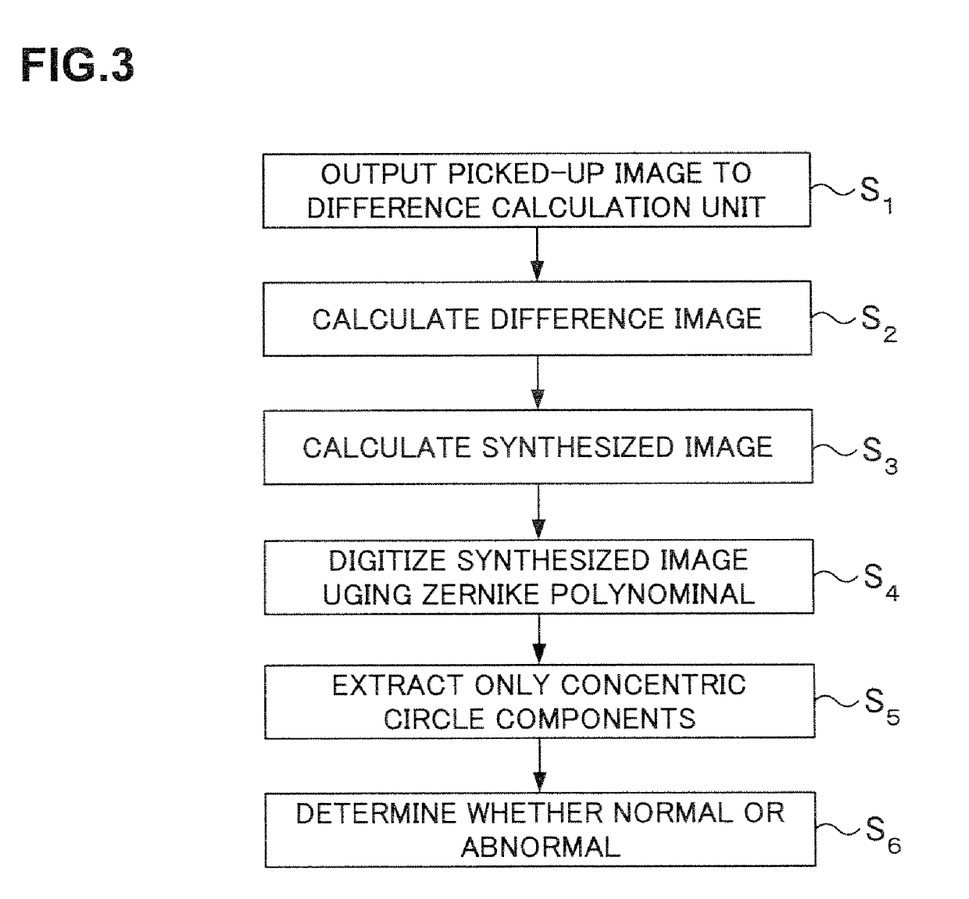
FIG. 3 is a flowchart showing a processing procedure of the inspection method of the present embodiment.

The inspection apparatus 1 used in this embodiment has the above-described configuration, and an inspection method using the inspection apparatus 1 will be described next with reference to a flowchart in FIG. 3.

First of all, when the wafer W being an inspection object is held on the stage 3 in the apparatus, the CCD camera 11 picks up an image of the front surface of the wafer W on a shot by shot basis according to a predetermined image-pickup order and outputs the image data to the difference calculation unit 21 in the control unit 12 (step S1). As described above, the difference calculation unit 21 calculates the difference between the previously stored image data on a normal wafer and the picked-up image obtained by the CCD camera 11 (step S2). The difference calculation unit 21 then outputs data (absolute value) on the difference image obtained by the calculation to the synthesis calculation unit 22. There is a difference in luminance or in brightness and darkness between the normal wafer and a wafer with a macro defect such as defocusing, uneven application or the like, and therefore digitization, for example, binarization of the data on the difference image presents a corresponding value if there is a defect, but determination may be difficult because its absolute value is small as it is.

In this embodiment, however, the difference image data from the difference calculation unit 21 is not digitized as it is, but the synthesis calculation unit 22 subsequent thereto performs processing of rotating the difference image from the difference calculation unit 21 360 degrees by every 10 degrees about the center of the wafer W, and synthesizing the difference image before the rotation and the difference image after the rotation so that each pixel value of the image after synthesis is increased (step S3). As a result, the concentric circle components are amplified.

The Zernike calculation unit 23 then decomposes the synthesized image into the above-described Zernike polynomial and analyzes it to calculate the Zernike value for each coefficient to thereby digitize the image (step S4), extracts from among them only the values of the Zernike coefficients of Z1, Z4, Z9 and Z16 being amplified concentric circle components (step S5), and outputs them to the determination unit 24. The determination unit 24 then compares the numerical values of the concentric circle components of the Zernike values with the previously set threshold values to perform processing of determining that the wafer is abnormal when the numerical values exceed the threshold values, whereas the wafer is normal when the numerical values are equal to or less than the threshold values (step S6).

The Zernike values being the numerical values for determination whether the wafer W is normal or abnormal, that is, the presence or absence of a defect outputted to the determination unit 24 are quite large by the rotation and synthesis, thereby facilitating setting of the threshold values for discriminating normal from abnormal, resulting in improved accuracy of determination as compared with the determination based on the simple digitization as in the prior art.

Figure 4:
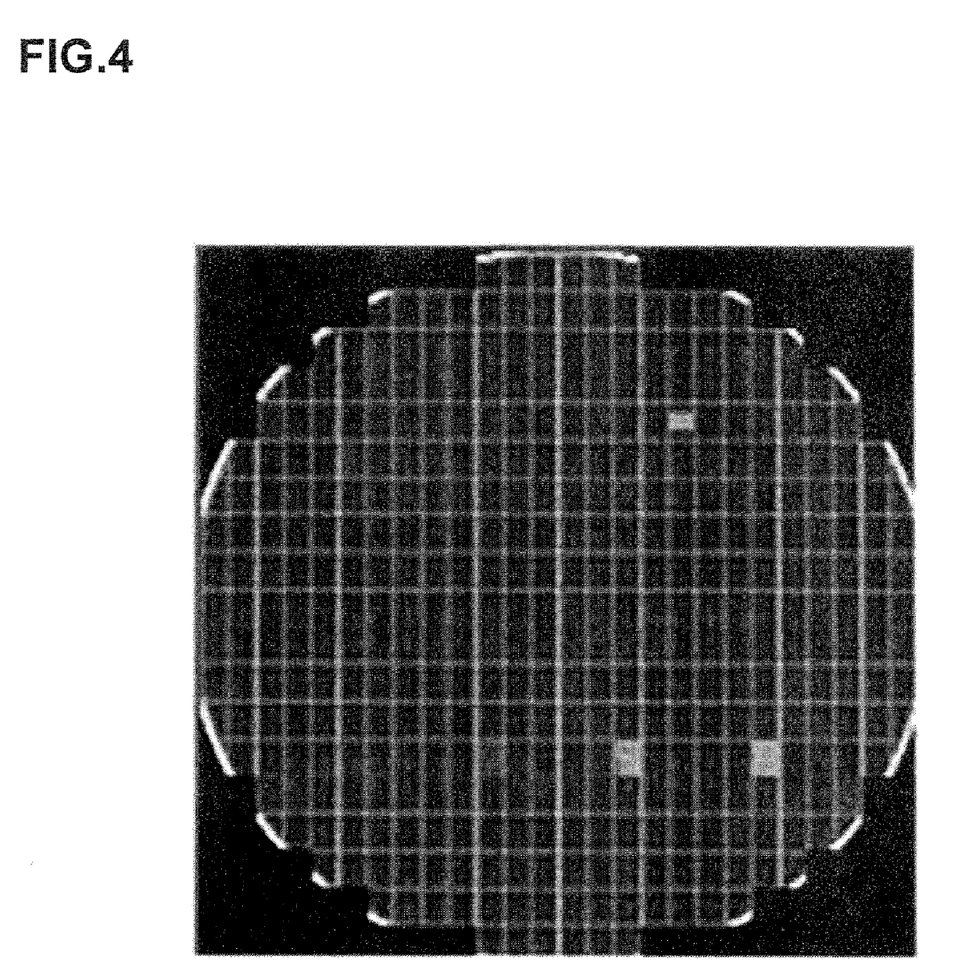
FIG. 4 is an explanatory view showing an image obtained by picking up an image of a wafer being an inspection object using a CCD camera.
Figure 5:
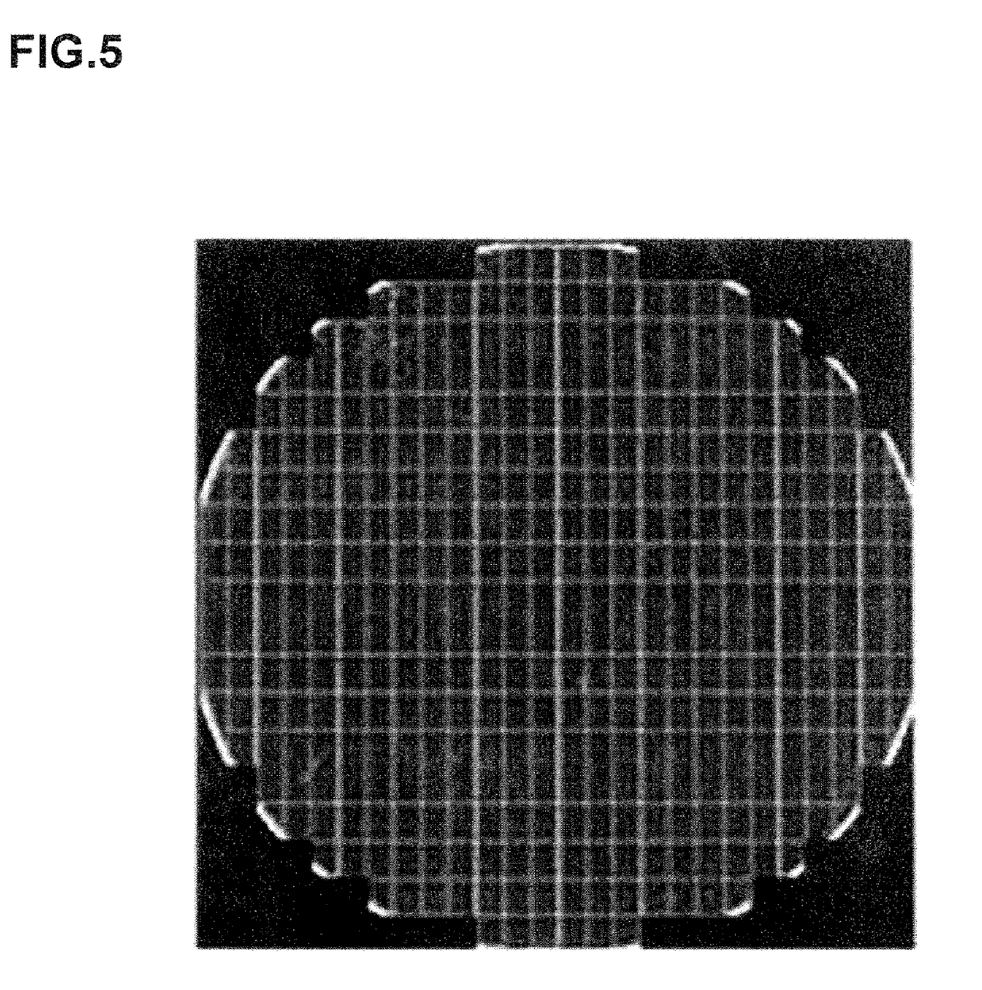
FIG. 5 is an explanatory view showing an image of a normal wafer.

Next, an example actually carried out by the present inventors will be described. This example is carried out to inspect for a defocus defect. FIG. 4 shows an image of the wafer being an inspection object picked up by the CCD camera 11, and FIG. 5 shows an image of a normal wafer (a so-called golden wafer). The difference image between the picked-up image in FIG. 4 and the image of the normal wafer in FIG. 5 results in the image shown in FIG. 6. Digitization of the difference image in FIG. 6 as it is does not present so distinct values, so that the as-is image is determined as being normal (Pass).

Figure 6:
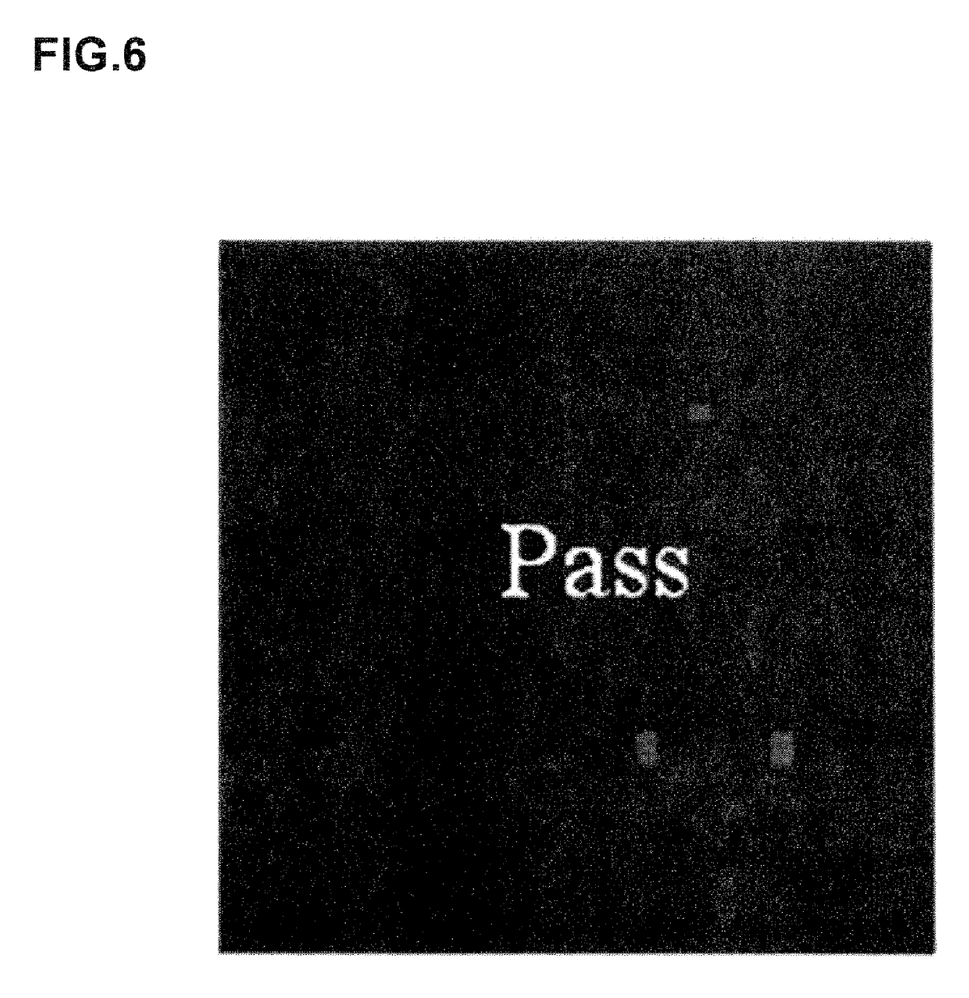
FIG. 6 is an explanatory view showing a difference image between the image of the wafer being the inspection object in FIG. 4 and the image of the normal wafer in FIG. 5.
Figure 7:
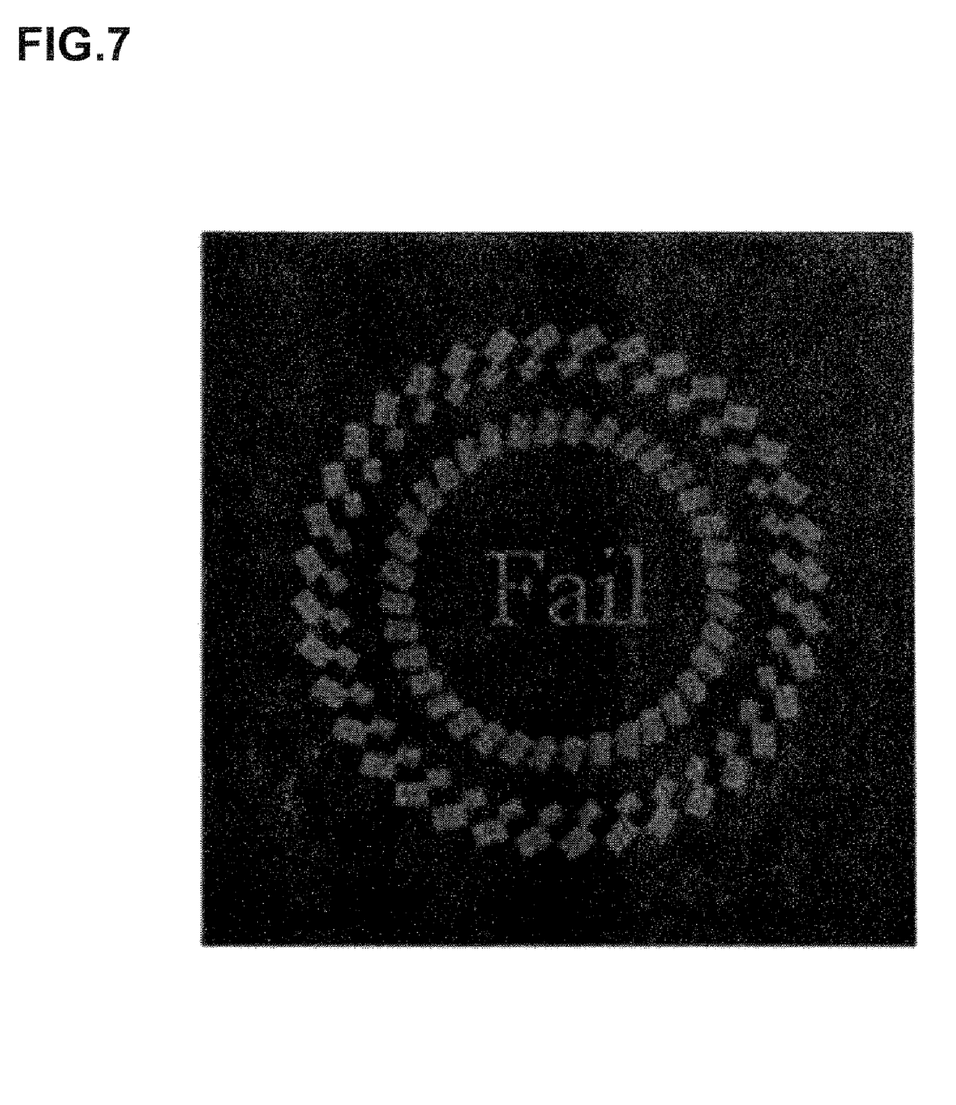
FIG. 7 is a synthesized image obtained by rotating the difference image in FIG. 6 and synthesizing the images.

According to this embodiment, however, the difference image in FIG. 6 is rotated 360 degrees by every 10 degrees about the center of the wafer, and the respective images are synthesized, so that regions considered to have a defect because of a difference in pixel value are continued in a concentric circle shape after the synthesis, resulting in an amplified difference as the entire synthesized image. The synthesized image in that case is shown in FIG. 7. The results of transforming the synthesized image in FIG. 7 into a Zernike polynomial and calculating the Zernike values of coefficients Z1 to Z16 of the respective components are shown in a table in FIG. 8. Note that since the image is a color image, the Zernike values are calculated and displayed for each of R, G, and B which are light's three primary colors in FIG. 8.

Figure 8:
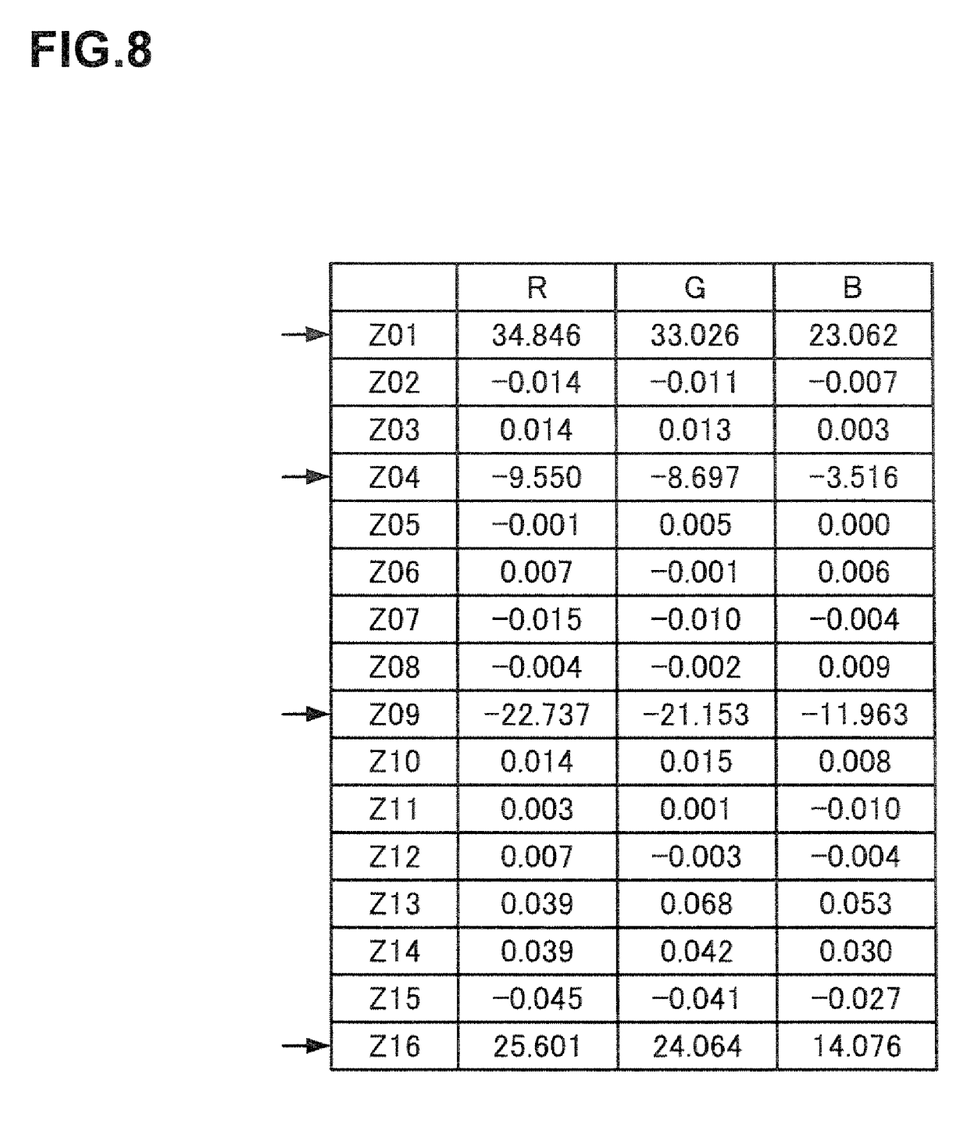
FIG. 8 is a table showing Zernike values obtained using the Zernike polynomial for each component, for the image in FIG. 7.

As can be seen also from the table in FIG. 8, any of the values of Z1, Z4, Z9 and Z16 being concentric circle components is distinctly larger than the values of the coefficients of the other components, and its absolute value is sufficiently larger than 0 for any of R, G, and B. As a matter of course, a wafer having Zernike values closer to zero has less difference from the normal wafer, that is, the wafer can be determined as normal. Accordingly, as seen from the table in FIG. 8, even if the threshold value (absolute vale) at Z1, Z4, Z9 and Z16 is set, for example, as high as 9 for R, determination whether the wafer is normal or abnormal can be made. Similarly, by setting the threshold values to, for example, 8 for G and to, for example, 3 for B, determination whether the wafer is normal or abnormal can be made with ease and with improved accuracy.

Figure 9:
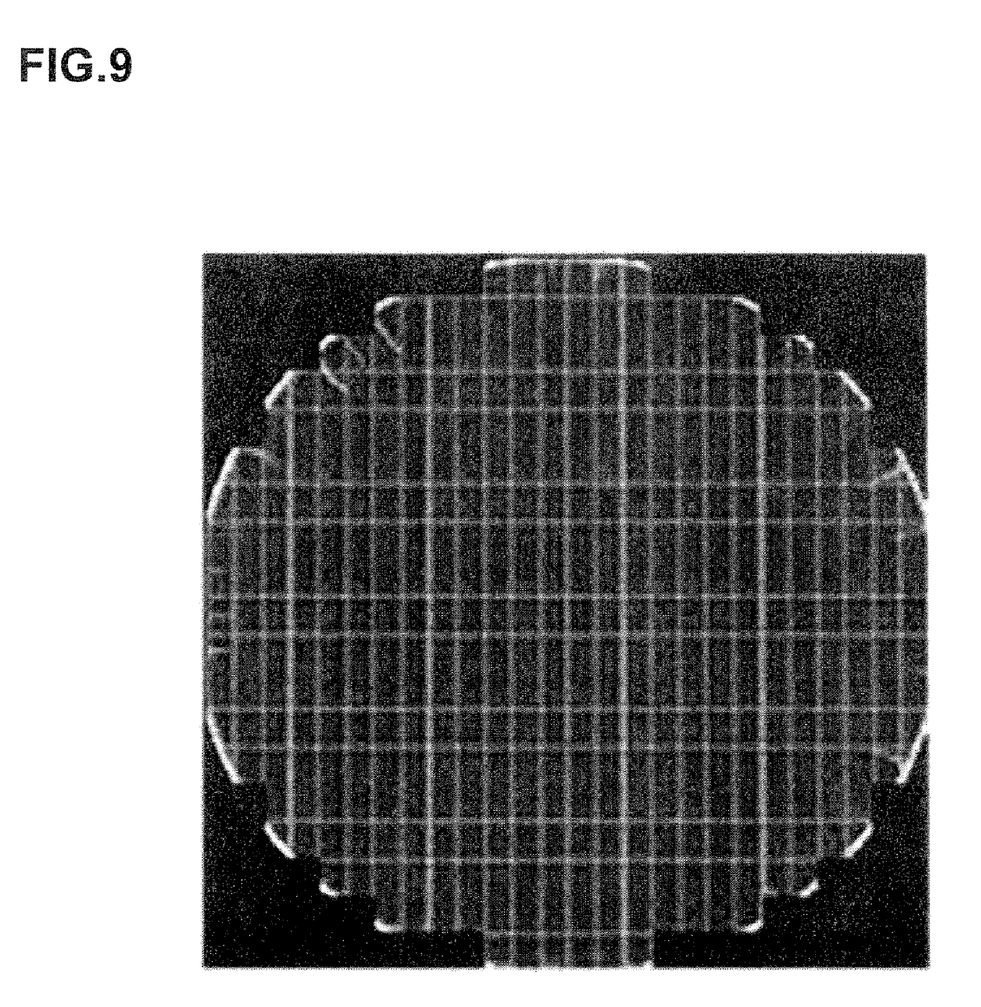
FIG. 9 is an explanatory view showing an image obtained by picking up an image of a wafer being an inspection object using the CCD camera.
Figure 10:
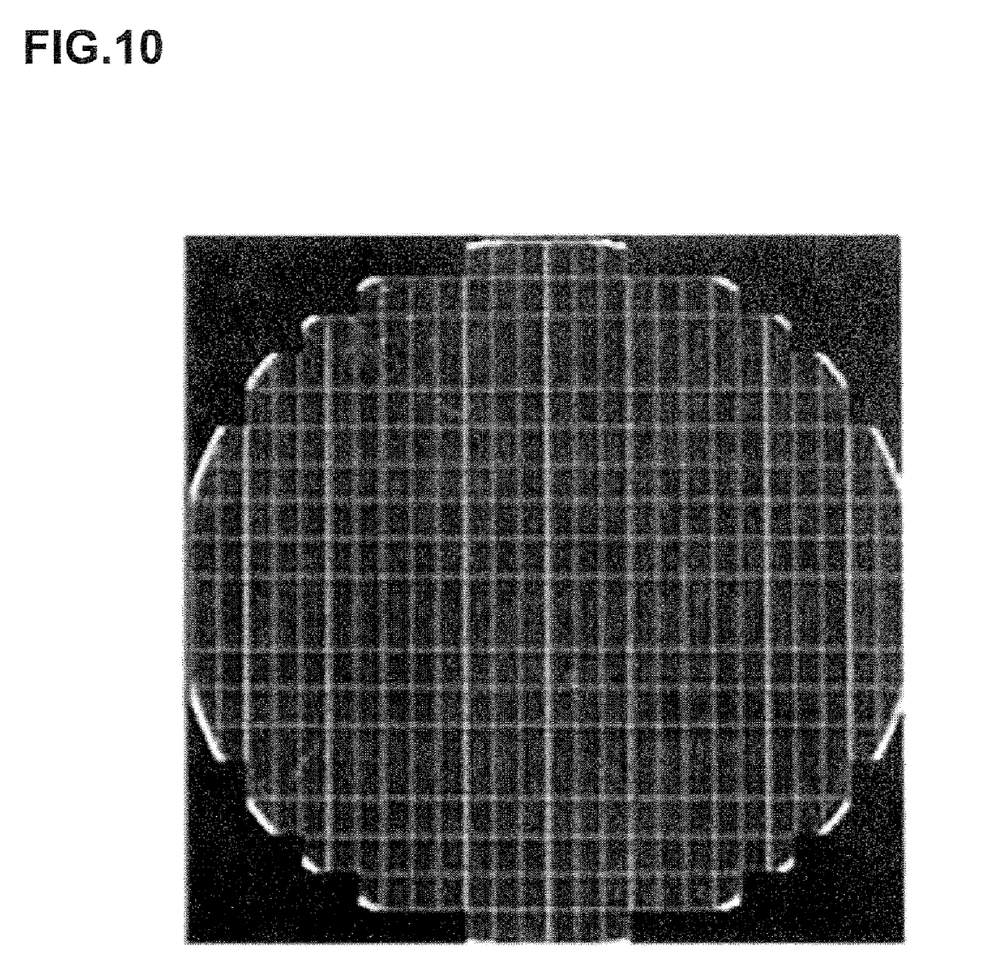
FIG. 10 is an explanatory view showing an image of a normal wafer.

Next, an example of inspecting the wafer for uneven application of the resist will be described. FIG. 9 shows an image of the wafer being an inspection object picked up by the CCD camera 11, and FIG. 10 shows an image of a normal wafer (a so-called golden wafer). The difference image between the picked-up image in FIG. 9 and the image of the normal wafer in FIG. 10 results in the image shown in FIG. 11. In this example of uneven application, regions considered to be defective exist at the peripheral portion of the wafer, each representing a very thin line appearing in a radial direction. Accordingly, binarization of the difference image in FIG. 11 as it is presents values close to 0, so that the as-is image is highly likely to be determined as being normal (Pass).

Figure 11:
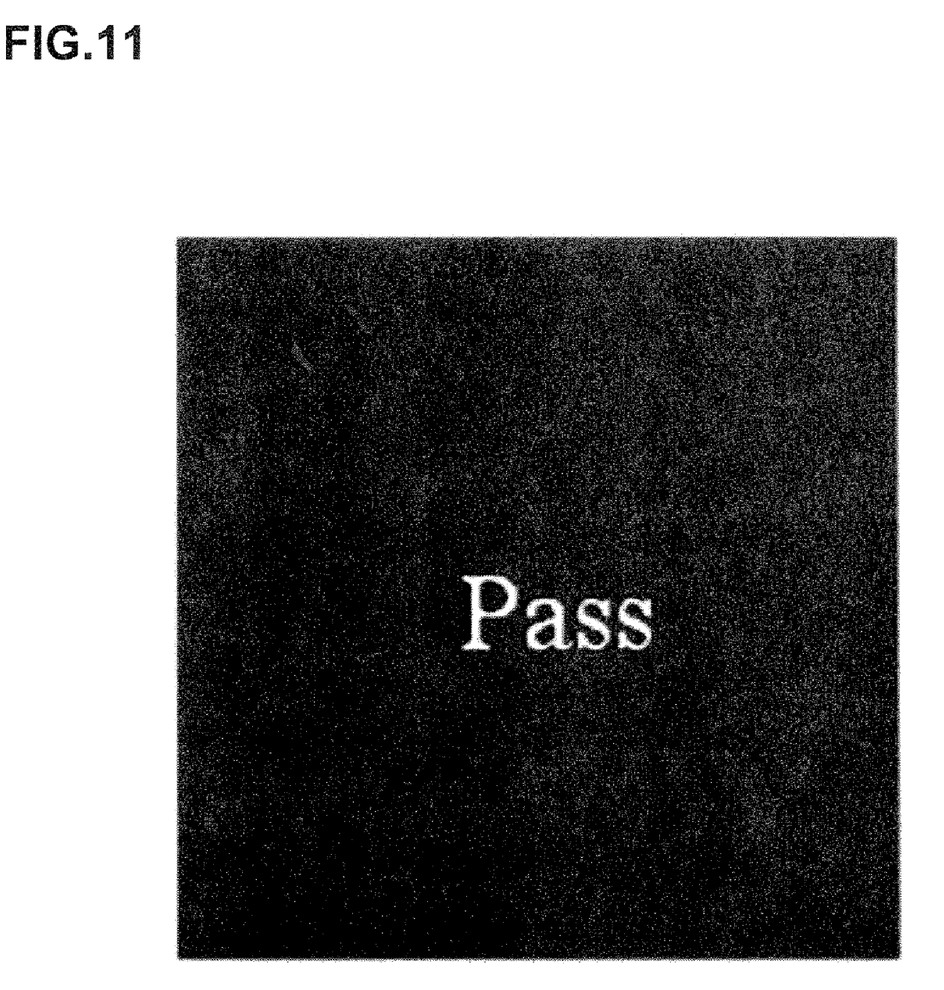
FIG. 11 is an explanatory view showing a difference image between the image of the wafer being the inspection object in FIG. 9 and the image of the normal wafer in FIG. 10.
Figure 12:
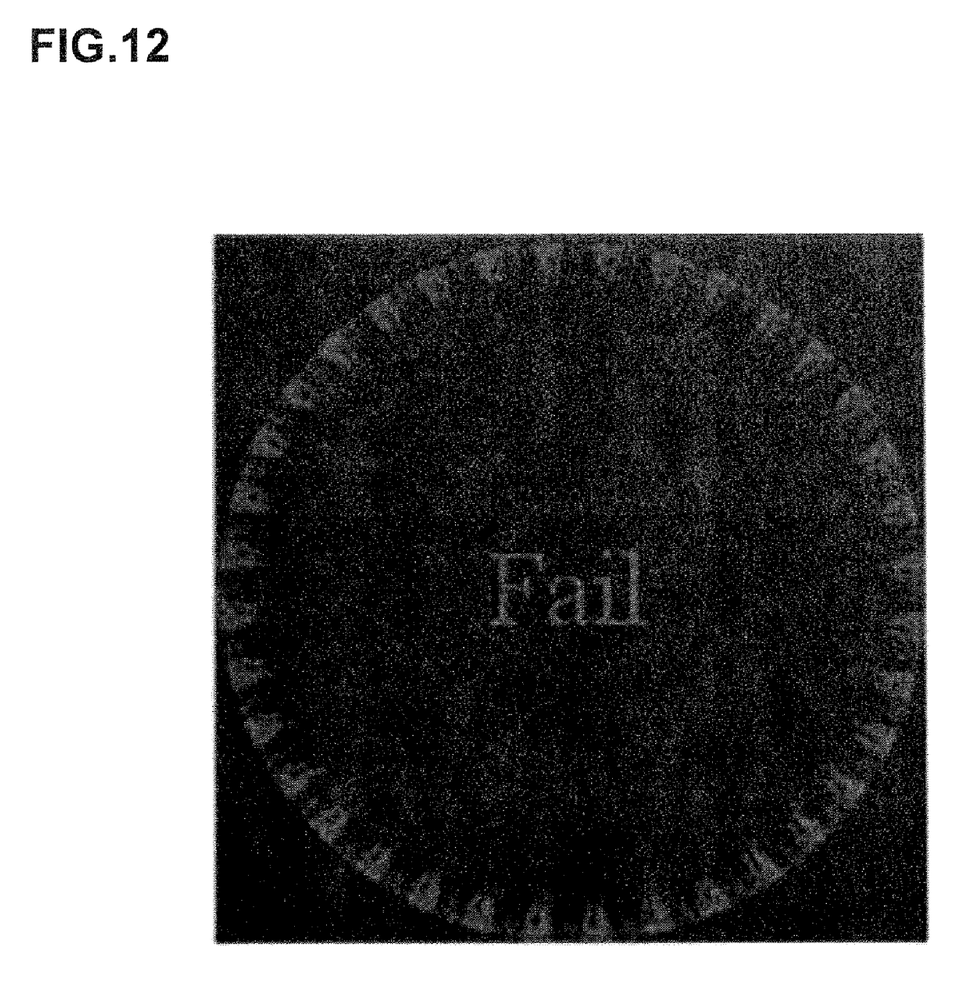
FIG. 12 is a synthesized image obtained by rotating the difference image in FIG. 11 and synthesizing the images.

According to this embodiment, however, the difference image in FIG. 11 is rotated 360 degrees by every 10 degrees about the center of the wafer, and the respective images are synthesized, so that the above-described thin lines appear to continue in a circumferential direction at the peripheral portion of the wafer where the lines exist as shown in FIG. 12. The results of transforming the synthesized image in FIG. 12 into a Zernike polynomial and calculating the Zernike values of coefficients Z1 to Z16 of the respective components are shown in a table in FIG. 13. Note that since the image is a color image, the Zernike values are calculated and displayed for each of R, G, and B which are light's three primary colors.

Figure 13:
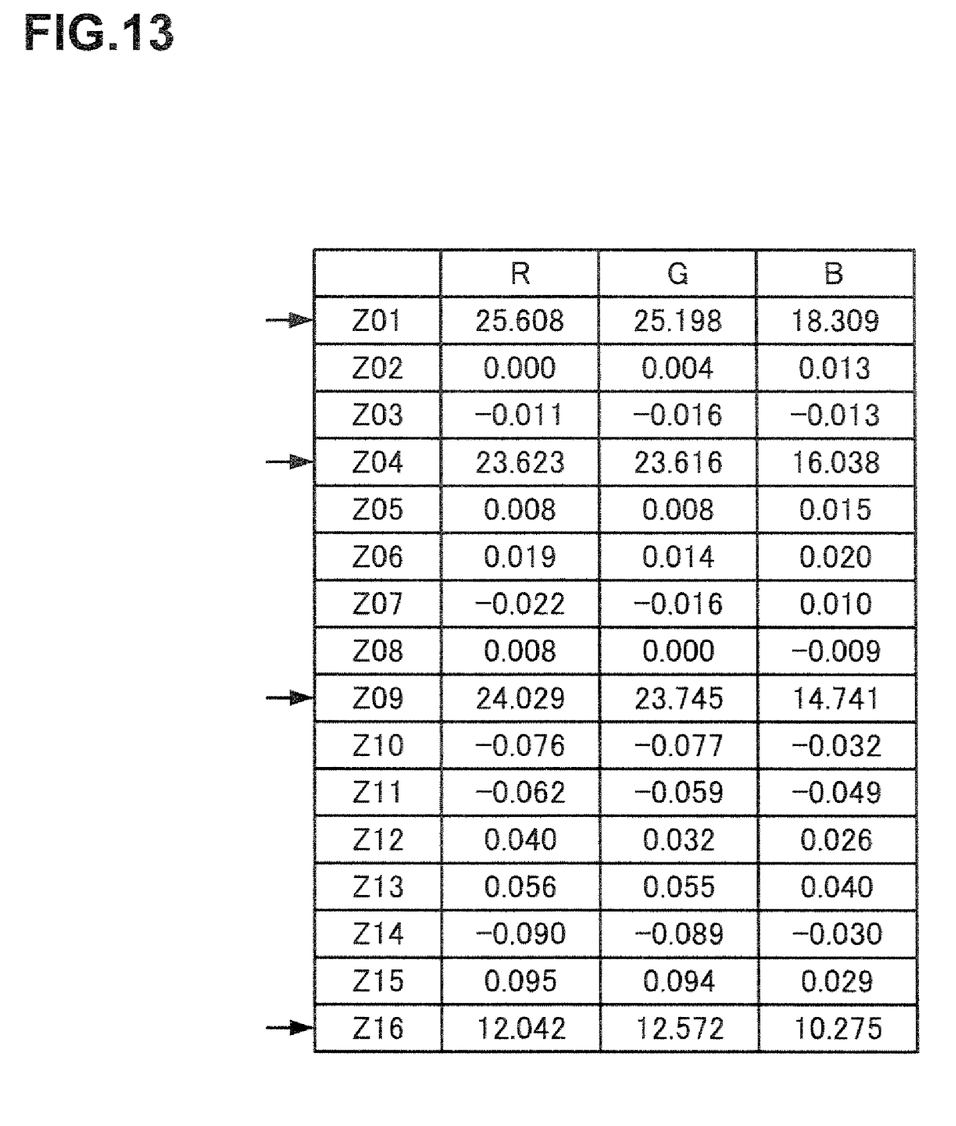
FIG. 13 is a table showing Zernike values obtained using the Zernike polynomial for each component, for the image in FIG. 12.

As can be seen also from the table in FIG. 13, any of the values of Z1, Z4, Z9 and Z16 being concentric circle components is distinctly larger than the values of the coefficients of the other components, and its absolute value is sufficiently larger than 0 for any of R, G, and B. Accordingly, as seen from the table in FIG. 13, even if the threshold value (absolute vale) at Z1, Z4, Z9 and Z16 is set, for example, as high as 12 for R, determination whether the wafer is normal or abnormal can be made. Similarly, by setting the threshold values to, for example, 12 for G and to, for example, 10 for B, determination whether the wafer is normal or abnormal can be made with ease and with improved accuracy.

As can be seen from the above-described examples, when the difference image is a color image, the synthesized image may be transformed into a Zernike polynomial, and when determining whether the wafer is normal or abnormal using the Zernike values of concentric circle components, a threshold value may be set for any one of R, G, and B, or threshold values can be set for R, G, and B respectively so that when the Zernike values exceed the threshold values for all of R, G, and B, the wafer is determined as abnormal to thereby further improve the accuracy. The concentric circle component may be set for any one of Z1, Z4, Z9 and Z16, or may be set for all of them so that the wafer is determined as abnormal when any of the values of the concentric circle components exceeds the predetermined threshold value and otherwise determined as normal, or the wafer is determined as abnormal only when all of the values of the concentric circle components exceed the predetermined threshold values.

Furthermore, the Zernike polynomial for use is not limited to one having coefficients Z1 to Z16 of components used in the above-described examples, but may be one having, for example, Z1 to Z9 or one having Z1 to Z45. It is all to use a Zernike polynomial having concentric circle components in component coefficients.

Further, for the difference image between the picked-up image and the normal image, the above-described synthesized image may be transformed into a Zernike polynomial to set threshold values based on the Zernike values of the concentric circle components so as to determine whether the wafer is normal or abnormal, not only for a color image but also for a monochrome image.

Note that while the wafer being an inspection object is determined as normal or abnormal directly from the value digitized using the Zernike polynomial in the above-described example, the wafer W can then be further subjected to multivariate analysis such as Mahalanobis' distance or the like, thereby further improving the accuracy.

The present invention is useful in inspecting a substrate for a defect using an image.

What is claimed is:

1. A method of inspecting a substrate for a defect, comprising the steps of:
    obtaining a difference image between an image of a normal substrate and an image of an inspection object;
    rotating the difference image 360 degrees by every predetermined angle about a center of the substrate, and synthesizing the difference image before the rotation and the difference image after the rotation so that each pixel value of the image after the synthesis is increased;
    digitizing using a Zernike polynomial the image obtained by the synthesis;
    determining the presence or absence of a defect on the substrate based on a Zernike value of a concentric circle component out of Zernike values digitized by the Zernike polynomial; and
    outputting information indicative of the determination whether the defect is absent or present.

2. The method as set forth in claim 1, wherein the predetermined angle is equal to or less than 10 degrees.

3. The method as set forth in claim 1, wherein the difference image is a color image, and the presence or absence of a defect on the substrate is determined based on the Zernike value of the concentric circle component of at least one of R, G, and B out of the Zernike values digitized by the Zernike polynomial.

4. The method as set forth in claim 1, wherein the difference image is a color image, and the presence or absence of a defect on the substrate is determined based on the Zernike values of the concentric circle components of all of R, G, and B out of the Zernike values digitized by the Zernike polynomial.

5. The method as set forth in claim 1, wherein the difference image is a monochrome image.

6. The method as set forth in claim 1, wherein the defect on the substrate is defocus during exposure processing.

7. The method as set forth in claim 1, wherein the defect on the substrate is uneven application of a resist formed on the substrate.

8. A computer readable storage medium storing a program for causing a computer to execute a substrate defect inspection method,
said defect inspection method comprising the steps of:
obtaining a difference image between an image of a normal substrate and an image of an inspection object;
rotating the difference image 360 degrees by every predetermined angle about a center of the substrate, and synthesizing the difference image before the rotation and the difference image after the rotation so that each pixel value of the image after the synthesis is increased;
digitizing using a Zernike polynomial the image obtained by the synthesis;
determining the presence or absence of a defect on the substrate based on a Zernike value of a concentric circle component out of Zernike values digitized by the Zernike polynomial; and
outputting information indicative of the determination whether the defect is absent or present.

9. A defect inspection apparatus for inspecting a substrate for a defect, comprising:
a stage mounting the substrate thereon and movable in an X-direction and a Y-direction:
an image pickup unit for picking up an image of the substrate on said stage;
a difference calculation unit for calculating an absolute value of a difference between image data obtained by said image pickup unit and previously stored image data on a normal substrate, and outputting data on a difference image based on the difference absolute value;
a synthesis calculation unit for rotating the difference image obtained by said difference calculation unit about a center of the substrate, and synthesizing the rotated difference images to obtain a synthesized image;
a Zernike calculation unit for digitizing the synthesized image obtained by said synthesis calculation unit by a Zernike polynomial; and
a determination unit for comparing data outputted from said Zernike calculation unit with a previously set threshold value.

10. The defect inspection apparatus as set forth in claim 9, wherein the difference image is a color image, and wherein said determination unit compares a Zernike value of a concentric circle component of at least one of R, G, and B out of the Zernike values digitized by said Zernike calculation unit, with a previously set threshold value.

11. The defect inspection apparatus as set forth in claim 9, wherein the difference image is a color image, and wherein said determination unit compares Zernike values of concentric circle components of all of R, G, and B out of the Zernike values digitized by said Zernike calculation unit, with previously set threshold values.

* * * * *